United States Patent
Park et al.

(10) Patent No.: US 11,322,368 B2
(45) Date of Patent: May 3, 2022

(54) METHOD FOR FABRICATING SEMICONDUCTOR PACKAGE

(71) Applicant: SAMSUNG ELECTRONICS CO., LTD., Suwon-si (KR)

(72) Inventors: Jung-Ho Park, Cheonan-si (KR); Jin-Woo Park, Seoul (KR); Seok Hyun Lee, Hwaseong-si (KR); Jae Gwon Jang, Hwaseong-si (KR); Gwang Jae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/037,003

(22) Filed: Sep. 29, 2020

(65) Prior Publication Data

US 2021/0257223 A1    Aug. 19, 2021

(30) Foreign Application Priority Data

Feb. 14, 2020 (KR) .......................... 10-2020-0018400

(51) Int. Cl.
*H01L 21/48* (2006.01)
*H01L 21/52* (2006.01)
*H01L 25/00* (2006.01)
*H01L 21/56* (2006.01)
*H01L 23/498* (2006.01)

(52) U.S. Cl.
CPC .......... *H01L 21/4853* (2013.01); *H01L 21/52* (2013.01); *H01L 21/565* (2013.01); *H01L 23/49816* (2013.01); *H01L 25/50* (2013.01)

(58) Field of Classification Search
CPC ... H01L 24/18; H01L 25/105; H01L 21/6835; H01L 21/52
See application file for complete search history.

(56) References Cited

U.S. PATENT DOCUMENTS 9,997,492 B2    6/2018 Yap et al.
10,157,854 B2   12/2018 Chen et al.
10,332,814 B2*  6/2019 Von Waechter ........ H01L 23/26
(Continued)

FOREIGN PATENT DOCUMENTS

KR      10-1323925      10/2013

*Primary Examiner* — Thao P Le
(74) *Attorney, Agent, or Firm* — F. Chau & Associates, LLC

(57) ABSTRACT

A method for fabricating a semiconductor package, the method including: forming a release layer on a first carrier substrate, wherein the release layer includes a first portion and a second portion, wherein the first portion has a first thickness, and the second portion has a second thickness thicker than the first thickness; forming a barrier layer on the release layer; forming a redistribution layer on the barrier layer, wherein the redistribution layer includes wirings and an insulating layer; mounting a semiconductor chip on the redistribution layer; forming a molding layer on the redistribution layer to at least partially surround the semiconductor chip; attaching a second carrier substrate onto the molding layer; removing the first carrier substrate and the release layer; removing the barrier layer; and attaching a solder ball onto the redistribution layer exposed by removal of the barrier layer and the second portion of the release layer.

20 Claims, 16 Drawing Sheets

(56) References Cited

U.S. PATENT DOCUMENTS

| | | | |
|---|---|---|---|
| 2004/0118599 A1* | 6/2004 | Chason | H01L 24/73 174/260 |
| 2014/0185259 A1* | 7/2014 | Ha Woo | H01L 24/09 361/777 |
| 2015/0041980 A1 | 2/2015 | Ahn et al. | |
| 2016/0146878 A1* | 5/2016 | Diguna | G01R 31/2818 257/48 |
| 2018/0122694 A1 | 5/2018 | Cheng et al. | |
| 2018/0122732 A1 | 5/2018 | Kuo et al. | |
| 2019/0122899 A1 | 4/2019 | Kwon et al. | |
| 2019/0172818 A1 | 6/2019 | Lin et al. | |
| 2019/0385921 A1* | 12/2019 | Shi | H01L 24/17 |
| 2021/0159189 A1* | 5/2021 | Yu | H01L 23/49503 |
| 2021/0181297 A1* | 6/2021 | Zhang | H01L 23/053 |
| 2021/0320079 A1* | 10/2021 | Baek | H01L 24/20 |
| 2021/0343667 A1* | 11/2021 | Chen | H01L 24/05 |

* cited by examiner

METHOD FOR FABRICATING SEMICONDUCTOR PACKAGE

CROSS-REFERENCE TO RELATED APPLICATION

This application claims priority under 35 U.S.C. § 119 to Korean Patent Application No. 10-2020-0018400, filed on Feb. 14, 2020 in the Korean Intellectual Property Office, the disclosure of which is incorporated by reference herein in its entirety.

TECHNICAL FIELD

Exemplary embodiments of the present inventive concept relate to a method for fabricating a semiconductor package.

DISCUSSION OF THE RELATED ART

As high-performance element implementation has become desirable, a semiconductor chip size has increased and a semiconductor package size has increased accordingly. In addition, the thickness of the semiconductor package has been reduced, which has provided slimmer electronic devices.

Generally, semiconductor packaging is a process of packaging a semiconductor chip such that the semiconductor chip (or a semiconductor die) is electrically connected to an electronic apparatus. A Fan-Out Wafer Level Package (FOWLP) type semiconductor package in which input/output terminals of the semiconductor package are disposed outside the semiconductor chip by utilizing a redistribution layer, as the size of the semiconductor chip decreases, has been proposed. Since the FOWLP type semiconductor package has a relatively simple packaging process and may realize a small thickness, the FOWLP type semiconductor package may be relatively thin, and has excellent thermal characteristics and electrical characteristics.

SUMMARY

According to an exemplary embodiment of the present inventive concept, a method for fabricating a semiconductor package, the method including: forming a release layer on a first carrier substrate, wherein the release layer includes a first portion and a second portion, wherein the first portion has a first thickness, and the second portion has a second thickness thicker than the first thickness; forming a barrier layer on the release layer; forming a redistribution layer on the barrier layer, wherein the redistribution layer includes a plurality of wirings and an insulating layer surrounding the plurality of wirings; mounting a semiconductor chip on the redistribution layer to be electrically connected to the redistribution layer; forming a molding layer on the redistribution layer to at least partially surround the semiconductor chip; attaching a second carrier substrate onto the molding layer; removing the first carrier substrate and the release layer; removing the barrier layer, and attaching a solder ball onto the redistribution layer exposed by removal of the barrier layer and the second portion of the release layer.

In an exemplary embodiment of the present inventive concept, the barrier layer includes a metal material.

In an exemplary embodiment of the present inventive concept, the metal material includes copper (Cu).

In an exemplary embodiment of the present inventive concept, the barrier layer includes the same material as the plurality of wirings.

In an exemplary embodiment of the present inventive concept, the formation of the release layer includes forming a first release layer having the first thickness on the first carrier substrate, and forming a second release layer on the first release layer, wherein the second release layer has a third thickness and includes an opening exposing at least a part of the first release layer, wherein the opening overlaps the first portion.

In an exemplary embodiment of the present inventive concept, the third thickness ranges between about 3 µm and about 8 µm.

In an exemplary embodiment of the present inventive concept, the removal of the release layer includes using a laser.

In an exemplary embodiment of the present inventive concept, the laser does not pass into the redistribution layer because of the barrier layer.

In an exemplary embodiment of the present inventive concept, the removal of the barrier layer and the second portion of the release layer exposes at least a part of the plurality of wirings of the redistribution layer, and the solder ball is electrically connected to the exposed plurality of wirings.

In an exemplary embodiment of the present inventive concept, the release layer includes the same material as the insulating layer.

In an exemplary embodiment of the present inventive concept, the release layer includes a photosensitive insulating material.

According to an exemplary embodiment of the present inventive concept, a method for fabricating a semiconductor package, the method including: forming a first release layer on a first carrier substrate; forming a second release layer on the first release layer, wherein the second release layer includes an opening for exposing at least a part of the first release layer; forming a barrier layer on the second release layer; forming a redistribution layer on the barrier layer, wherein the redistribution layer includes a plurality of wirings and an insulating layer surrounding the plurality of wirings; mounting a first semiconductor chip on the redistribution layer, wherein the first semiconductor chip is electrically connected to the redistribution layer; attaching a second carrier substrate onto the first semiconductor chip; removing the first carrier substrate, the first release layer and the second release layer using a laser; removing the barrier layer; and attaching a solder ball to a position of the redistribution layer from which the second release layer is removed, wherein the first release layer and the second release layer include a photosensitive insulating material.

In an exemplary embodiment of the present inventive concept, the first carrier substrate is a glass substrate.

In an exemplary embodiment of the present inventive concept, the second release layer has a thickness ranging between about 3 µm and about 8 µm.

In an exemplary embodiment of the present inventive concept, the barrier layer includes a metal material.

In exemplary embodiment of the present inventive concept, the method for fabricating the semiconductor package further including: after mounting the first semiconductor chip on the redistribution layer, forming a first molding layer on the redistribution layer, wherein the first molding layer at least partially surrounds the first semiconductor chip and includes a penetration via penetrating the first molding layer; and mounting a second semiconductor chip on the first molding layer, wherein the second semiconductor chip is electrically connected to the redistribution layer through the penetration via, and the second carrier substrate is attached onto the second semiconductor chip.

In an exemplary embodiment of the present inventive concept, the second semiconductor chip is electrically connected to the redistribution layer through the penetration via.

In an exemplary embodiment of the present inventive concept, the method for fabricating the semiconductor package further includes: after mounting the first semiconductor chip on the redistribution layer, forming a first molding layer on the redistribution layer, wherein the first molding layer at least partially surrounds the first semiconductor chip; forming connection substrates at opposing sides of the first semiconductor chip, wherein the connection substrates include a plurality of sub-wiring and a base layer at least partially surrounding the plurality of sub-wiring; and mounting a package on the first molding layer, wherein the package includes a substrate, a second semiconductor chip mounted on the substrate, and a second molding layer at least partially surrounding the second semiconductor chip on the substrate, wherein the second carrier substrate is attached onto the second molding layer, and the second semiconductor chip is electrically connected to the redistribution layer through the substrate and the connection substrate.

According to an exemplary embodiment of the present inventive concept, a method for fabricating a semiconductor package, the method including: forming a first release layer on a first carrier substrate; forming a second release layer on the first release layer, wherein the second release layer includes a first opening for exposing at least a part of an upper surface of the first release layer; forming a barrier layer on the second release layer, wherein the barrier layer extends along an upper surface of the second release layer and includes a metal material; forming an electrode pattern support layer on the barrier layer, wherein the electrode pattern support layer exposes at least a part of the barrier layer and includes a second opening not overlapping the first opening; forming a redistribution layer on the electrode pattern support layer, wherein the redistribution layer includes a plurality of wirings and an insulating layer surrounding the plurality of wirings; mounting a semiconductor chip on the redistribution layer; forming a molding layer surrounding the semiconductor chip on the redistribution layer, attaching a second carrier substrate onto the molding layer; removing the first carrier substrate, the first release layer and the second release layer, using a laser; removing the barrier layer; forming a solder ball at a position from which the second release layer is removed; and removing the second carrier substrate, wherein the first release layer, the second release layer and the insulating layer include a photosensitive insulating material.

In an exemplary embodiment of the present inventive concept, wherein the barrier layer includes the same material as the plurality of wirings.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
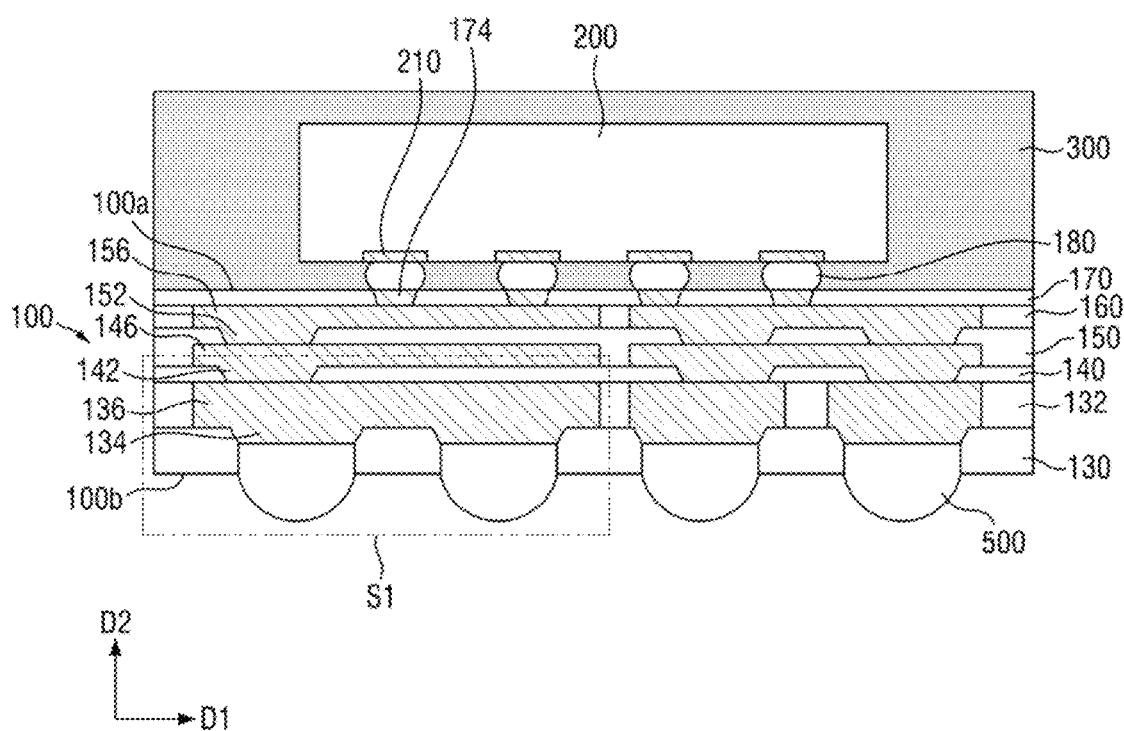
FIG. 1 is a diagram illustrating a semiconductor package fabricated by a method for fabricating a semiconductor package according to an exemplary embodiment of the present inventive concept.

FIG. 1 is a diagram illustrating a semiconductor package fabricated by a method for fabricating a semiconductor package according to an exemplary embodiment of the present inventive concept.

Referring to FIG. 1, a semiconductor package fabricated by the method for fabricating the semiconductor package according to an exemplary embodiment of the present inventive concept may include a redistribution layer 100, a first semiconductor chip 200, a first molding layer 300, and a solder ball 500.

The redistribution layer 100 may include a first surface 100a and a second surface 100b facing each other. For example, the first surface 100a may be an upper surface of the redistribution layer 100 with respect to a second direction D2, and the second surface 100b may be a lower surface of the redistribution layer 100 with respect to the second direction D2.

The redistribution layer 100 may include an electrode pad 134, an electrode pad support layer 130, a plurality of wirings 136, 146, 156 and 174, a plurality of vias 142 and 152, and a plurality of insulating layers 132, 140, 150, 160 and 170.

The electrode pad support layer 130 may form the second surface 100b of the redistribution layer 100. For example, a lower surface of the electrode support layer 130 may be the lower surface 100b of the redistribution layer 100. The electrode pad support layers 130 may be disposed to be spaced apart from each other in the second direction D2. The electrode pad support layer 130 may include an insulating material. The electrode pad support layer 130 may include, for example, a photosensitive insulating material (e.g., PID: Photo Imagable Dielectric). The electrode pad support layer 130 may include, for example, epoxy or polyimide. However, the present inventive concept is not limited thereto.

The electrode pad 134 may be formed on the second surface 100b of the redistribution layer 100. The electrode pad 134 may be included in the electrode pad support layer 130. The electrode pad 134 may be disposed in the electrode pad support layer 130 to be spaced in the first direction D1. The lower surface of the electrode pad 134 may be located above the lower surface of the electrode pad support layer 130. Hereinafter, a detailed description will be given with reference to FIG. 2.

The electrode pad 134 and the plurality of wirings 136, 146, 156 and 174 may extend along a first direction D1. The electrode pad 134 and the plurality of wirings 136, 146, 156 and 174 may be spaced apart from each other in the first direction D1. Here, the first direction D1 may mean a direction substantially perpendicular to the second direction D2.

The plurality of wirings 136, 146, 156 and 174 may be sequentially stacked on the electrode pad 134 from the second surface 100*b* to the first surface 100*a* of the redistribution layer 100. The plurality of wirings 136, 146, 156 and 174 may be spaced apart from each other in the second direction D2. For example, a first wiring 136 may be formed on the electrode pad 134, and a second wiring 146 may be formed on the first wiring 136. In addition, a third wiring 156 may be formed on the second wiring 146, and a fourth wiring 174 may be formed on the third wiring 156. For example, the plurality of wirings 136, 146, 156 and 174 may be formed at different levels from each other.

The plurality of wirings 136, 146, 156 and 174 may include patterns that perform various functions. The plurality of wirings 136, 146, 156 and 174 may include, for example, a ground pattern, a power pattern, a signal pattern and the like. The signal pattern may input and output, for example, various electric signals such as a data electric signal, but not a ground signal and a power signal.

For example, the widths of the plurality of vias 142 and 152 may increase from the first surface 100*a* toward the second surface 100*b*; however, the present inventive concept is not limited thereto, and the widths of the plurality of vias 142 and 152 may be substantially the same. The plurality of wirings 136, 146, 156 and 174 may be electrically connected to each other through the plurality of vias 142 and 152. The plurality of vias 142 and 152 may interconnect the plurality of wirings 136, 146, 156 and 174 formed at different levels from each other. For example, the first via 142 may penetrate the second insulating layer 140 to connect the first wiring 136 and the second wiring 146 to each other. The second via 152 may penetrate the third insulating layer 150 to connect the second wiring 146 and the third wiring 156 to each other.

The electrode pad 134, the plurality of wirings 136, 146, 156 and 174 and the plurality of vias 142 and 152 may include a conductive material. The electrode pad 134 may include the same material as the plurality of wirings 136, 146, 156 and 174 and the plurality of vias 142 and 152. The electrode pad 134, the plurality of wirings 136, 146, 156 and 174 and the plurality of vias 142 and 152 may be, for example, but is not limited to, copper (Cu). In another example, the electrode pad 134, the plurality of wirings 136, 146, 156 and 174 and the plurality of vias 142 and 152 may include at least one of aluminum (Al), silver (Ag), tin (Sn), gold (Au), nickel (Ni), lead (Pb), titanium (Ti) and alloys thereof.

The plurality of insulating layers 132, 140, 150, 160 and 170 may surround the plurality of wirings 136, 146, 156 and 174 and the plurality of vias 142 and 152. For example, the plurality of wirings 136, 146, 156 and 174 and the plurality of vias 142 and 152 may be formed inside the plurality of insulating layers 132, 140, 150, 160 and 170. For example, the first wiring 136 may be formed inside the first insulating layer 132.

The plurality of insulating layers 132, 140, 150, 160 and 170 may include an insulating material. For example, the plurality of insulating layers 132, 140, 150, 160 and 170 may include the same material as that of the electrode pad support layer 130. For example, the plurality of insulating layers 132, 140, 150, 160 and 170 may include, for example, a photosensitive insulating material. The plurality of insulating layers 132, 140, 150, 160 and 170 may include, for example, epoxy or polyimide. However, the present inventive concept is not limited thereto.

The plurality of wirings 136, 146, 156 and 174, the plurality of vias 142 and 152, and the plurality of insulating layers 132, 140, 150, 160 and 170 shown in the drawings are merely examples, and the numbers, the positions, the thicknesses and/or the arrangements of each of the plurality of wirings 136, 146, 156 and 174, the plurality of vias 142 and 152 and the plurality of insulating layers 132, 140, 150, 160 and 170 are not limited thereto, and may be various.

The first semiconductor chip 200 may be mounted on the first surface 100*a* of the redistribution layer 100. The redistribution layer 100 may include a fan-in region (e.g., a first fan-out region) and another fan-out region (e.g., a second fan-out region). For example, the fan-out region overlaps the first semiconductor chip 200, and the other fan-out region does not overlap the first semiconductor chip 200. The other fan-out region is a remaining region except the overlapping region (e.g., the first fan-out region). For example, the semiconductor package according to an exemplary embodiment of the present inventive concept may be a fan-out semiconductor package (FOWLP). Although the semiconductor package according to an exemplary embodiment of the present inventive concept shows a fan-out semiconductor package in the drawings, the present inventive concept is not limited thereto and may be, for example, a wafer level package (WLP).

The first semiconductor chip 200 may be a logic chip or a memory chip. The first semiconductor chip 200 may be, but is not limited to, an application processor (AP) such as a central processing unit (CPU), a graphic processing unit (GPU), a field-programmable gate array (FPGA), a digital signal processor, an encryption processor, a microprocessor, and a microcontroller, and may be a logic chip such as an analog-digital converter (ADC) or an application-specific integrated circuit (ASIC). In another example, the first semiconductor chip 200 may be a memory chip such as a volatile memory (e.g., a DRAM) or a non-volatile memory (e.g., a ROM or a flash memory). In addition, the first semiconductor chip 200 may be configured by combining logic chips, by combining memory chips, and by combining logic chips and memory chips.

The first semiconductor chip 200 may include a first connection pad 210. The first connection pad 210 may be disposed on a lower surface in the first semiconductor chip 200. However, the present inventive concept is not limited thereto, and the first connection pad 210 may entirely protrude or partially protrude from the first semiconductor chip 200 to the first surface 100*a* of the redistribution layer 100. The first connection pads 210 may be formed to be spaced apart from each other in the first direction D1.

The first connection pad 210 may be electrically connected to an electric circuit formed in the first semiconductor chip 200. The first connection pad 210 may include a conductive material. The first connection pad 210 may include a metal material such as aluminum (Al).

A first connection terminal 180 may be formed on the first connection pad 210. The first connection terminal 180 may be disposed between the first surface 100*a* of the redistribution layer 100 and the first connection pad 210. The first connection terminal 180 may be in contact with the fourth wiring 174 exposed at the first surface 100*a* of the redistribution layer 100. The first connection terminal 180 may be in contact with the first connection pad 210. The first connection terminal 180 may electrically connect the first semiconductor chip 200 and the redistribution layer 100 to each other.

The first connection terminal 180 may be, for example, a solder ball, a solder bump or a combination thereof. Although the first connection terminal 180 is shown as having a ball shape in the drawing, the present inventive concept is not limited thereto. Although the first connection terminal 180 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the present inventive concept is not limited thereto.

The first molding layer 300 may cover both the side surface and the upper surface of the first semiconductor chip 200. The first molding layer 300 may at least partially surround the side surface and the upper surface of the first semiconductor chip 200, and may be disposed between the first semiconductor chip 200 and the first surface 100a of the redistribution layer 100. The first molding layer 300 may surround the first connection terminal 180 and may fill the space between the first connection terminals 180 adjacent to each other. The side surface of the first molding layer 300 and the side surface of the redistribution layer 100 may be coplanar.

Although the first molding layer 300 is shown to cover the upper surface of the first semiconductor chip 200 in this drawing, the upper surface of the first molding layer 300 and the upper surface of the first semiconductor chip 200 may be coplanar. For example, the upper surface of the first molding layer 300 may be partially etched by the planarization process, and may expose the upper surface of the first semiconductor chip 200.

The first molding layer 300 may include, for example, an epoxy molding compound (EMC) or two or more kinds of silicon hybrid materials.

The solder balls 500 may be disposed on the second surface 100b of the redistribution layer 100. The solder ball 500 may convexly protrude from the second surface 100b of the redistribution layer 100. The solder ball 500 may be in contact with the electrode pad 134 exposed by the second surface 100b of the redistribution layer 100. Therefore, the solder ball 500 may be electrically connected to the redistribution layer 100. In addition, the semiconductor package may be electrically connected to an external device through the solder ball 500.

Although a width of the solder ball 500 in the first direction D1 is shown to be the same as a width of the electrode pad 134 in the first direction D1 in this drawing, the present inventive concept is not limited thereto. For example, the width of the solder ball 500 in the first direction D1 may be larger or smaller than the width of the electrode pad 134 in the first direction D1.

The number, shape, size, and arrangement of the solder balls 500 shown in the drawings are not limited thereto and may be various. For example, the solder ball 500 may be substantially the same in size and shape as the first connection terminal 180, and may be different from each other as shown in this drawing. For example, the solder ball 500 may be larger in size than the first connection terminal 180.

The solder ball 500 may be disposed on the electrode pad support layer 130. At least a part of the solder ball 500 may be in contact with the electrode pad support layer 130. For example, at least a part of the solder balls 500 may be disposed in the redistribution layer 100.

The solder ball 500 may include, for example, but is not limited to, at least one of tin (Sn), indium (In), lead (Pb), zinc (Zn), nickel (Ni), gold (Au), silver (Ag), copper (Cu), antimony (Sb), bismuth (Bi) and combinations thereof.

Figure 2:
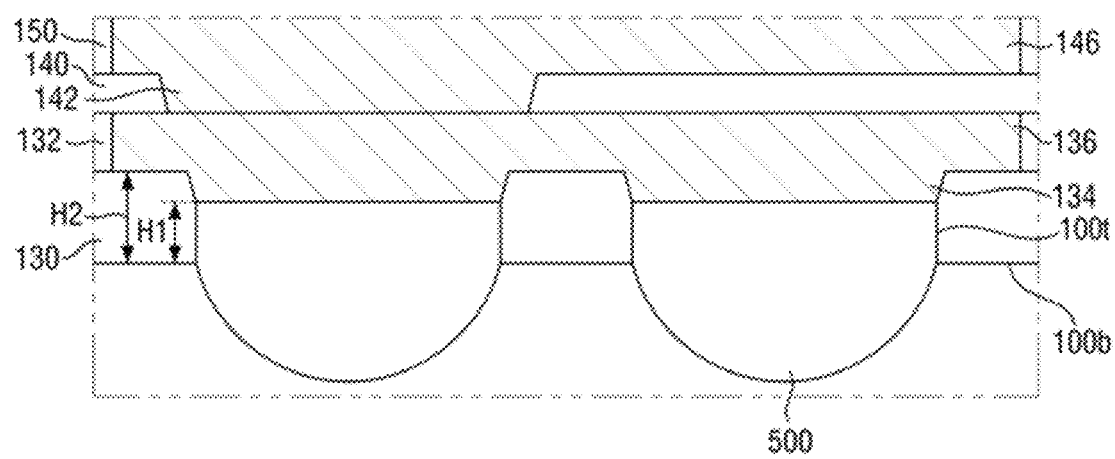
FIG. 2 is an enlarged view of region S1 of FIG. 1.
Figure 2:

FIG. 2 is an enlarged view region S1 of FIG. 1.

Referring to FIG. 2, the electrode pad 134 may be disposed on the first wiring 136. A height from the second surface 100b of the redistribution layer 100 to the electrode pad 134 in the second direction D2 may be a first height H1. A height from the second surface 100b of the redistribution layer 100 to the first wiring 136 in the second direction D2 may be a second height H2. The second height H2 may be greater than the first height H1. However, the present inventive concept is not limited thereto. For example, the second height H2 may be the same as the first height H1, or the second height H2 may be less than the first height H1.

For example, the electrode pad 134 may protrude from the first wiring 136 toward the second surface 100b of the redistribution layer 100. The electrode pad 134 and the second surface 100b of the redistribution layer 100 may not be coplanar, and the electrode pad 134 may be disposed above the second surface 100b of the redistribution layer 100 in the second direction D2.

The lower surface of the electrode pad support layer 130 may form the second surface 100b of the redistribution layer 100. The electrode pad support layer 130 may adjoin the side surface of the electrode pad 134, the lower surface of the first wiring 136 and the lower surface of the first insulating layer 132. For example, the electrode pad support layer 130 may have the second height H2 in the second direction D2.

The second surface 100b of the redistribution layer 100 may include at least one trench 100t. The trench 100t may be provided by the electrode pad support layer 130 and the electrode pad 134. The trench 100t may expose at least a part of the electrode pad 134 and at least a part of the electrode pad support layer 130. A depth of the trench 100t in the second direction D2 may be the first height H1.

Solder balls 500 may be disposed in the trench 100t. The solder balls 500 may be disposed on the electrode pads 134 exposed by the trenches 100t. The solder balls 500 may adjoin the electrode pads 134.

The solder ball 500 may include a region placed in the redistribution layer 100 and a region placed outside the redistribution layer 100. Further, at least a part of the solder ball 500 may adjoin the electrode pad support layer 130. The electrode pad support layer 130 may surround at least a part of the solder ball 500. The solder ball 500 may include a region that adjoins the electrode pad support layer 130 and a region that does not adjoin the electrode pad support layer 130.

Therefore, although the semiconductor package, fabricated by the method for fabricating a semiconductor package according to an exemplary embodiment of the present inventive concept, is fabricated by, for example, a chip last process to be described later, at least a part of the solder ball 500 may be disposed inside the redistribution layer 100. For example, since at least a part of the solder ball 500 may be surrounded by the electrode pad support layer 130, the bonding reliability between the solder ball 500 and the electrode pad 134 may be increased or developed.

FIGS. 3 to 12 are intermediate step diagrams illustrating a method for fabricating a semiconductor package according to an exemplary embodiment of the present inventive concept. The method for fabricating the semiconductor package according to an exemplary embodiment of the present inventive concept will be described with reference to FIGS. 3 to 12.

Figure 3:
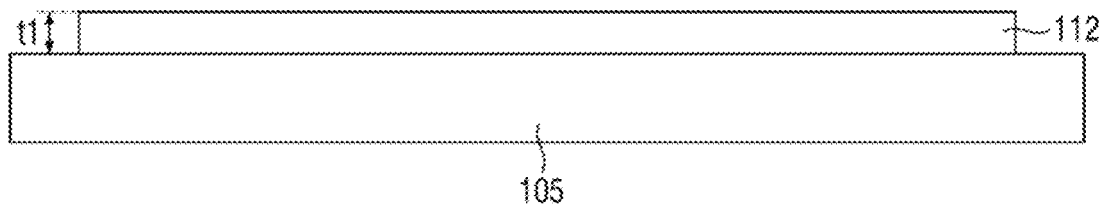
FIGS. 3, 4, 5, 6, 7, 8, 9, 10, 11 and 12 are intermediate step diagrams illustrating a method for fabricating a semiconductor package according to an exemplary embodiment of the present inventive concept.
Figure 3:
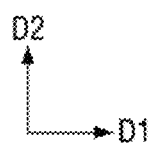

Referring to FIG. 3, the method for fabricating the semiconductor package according to an exemplary embodiment of the present inventive concept may include forming a first release layer 112 on a first carrier substrate 105.

The first carrier substrate 105 may be, for example, a glass substrate. Although the first carrier substrate 105 may include silicon, metal, plastic, ceramics or the like, the present inventive concept is not limited thereto.

The first release layer 112 may adjoin the first carrier substrate 105. The first release layer 112 may be formed on the first carrier substrate 105. The thickness of the first release layer 112 in the second direction D2 may be a first thickness t1. For example, the first release layer 112 may be formed by a vapor deposition or a coating process.

The first release layer 112 may include a photosensitive insulating material (e.g., PhotoImagable Dielectric: PID). The photosensitive insulating material can be subjected to a photolithography process, and may be fabricated at a wafer level. Accordingly, the first release layer 112 may be formed thinner, and the plurality of wirings 136, 146, 156 and 174 and the vias 142 and 152 to be described later may be formed at a finer pitch.

In an exemplary embodiment of the present inventive concept, the first release layer 112 may be formed on the first carrier substrate 105 by, an adhesive layer. For example, the adhesive layer may be further interposed between the first carrier substrate 105 and the first release layer 112. The adhesive layer may be made up of a single layer or a plurality of layers. The adhesive layer may include, for example, a polymer-based material light-to-hit conversion (LTHC) that may be removed together with the first carrier substrate 105. The adhesive layer may include, for example, titanium (Ti) in another example.

Figure 4:
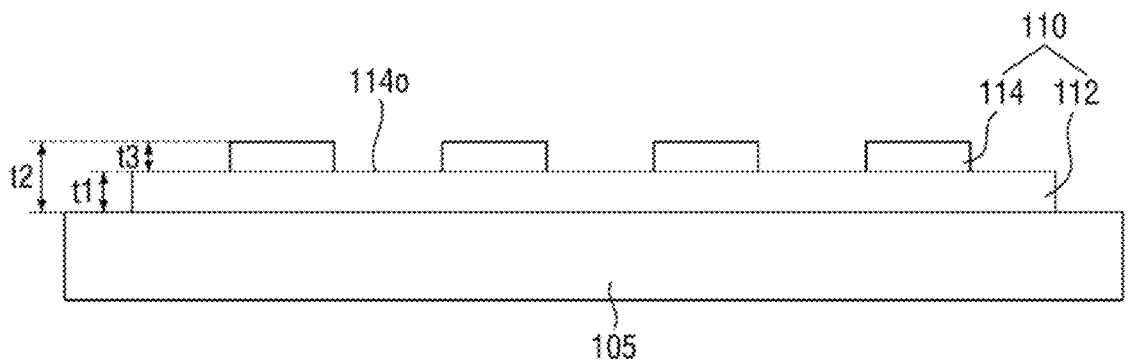
Figure 4:
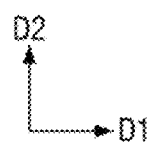

Referring to FIG. 4, a second release layer 114 may be formed on the first release layer 112. The second release layer 114 may expose at least a part of the first release layer 112. The second release layer 114 may include a first opening 114o that exposes at least a part of an upper surface of the first release layer 112.

The second release layer 114 may include, for example, the same material as the first release layer 112. Therefore, the release layer 110 including a first region having a first thickness t1 and a second region having a third thickness t3 may be formed on the first carrier substrate 105. The release layer 110 may include the first release layer 112 and the second release layer 114. Here, a second thickness t2 may be a value obtained by adding up the first thickness t1 and the third thickness t3.

The second release layer 114 may include a photosensitive insulating material. The second release layer 114 may be formed to have a third thickness t3 in the second direction D2 by, for example, a vapor deposition or a coating process. Thereafter, the first opening 114O may be formed by an exposure and development process performed on the second release layer 114. Here, although the third thickness t3 may be, for example, ranging between about 3 µm and about 8 µm, the present inventive concept is not limited thereto.

Figure 5:
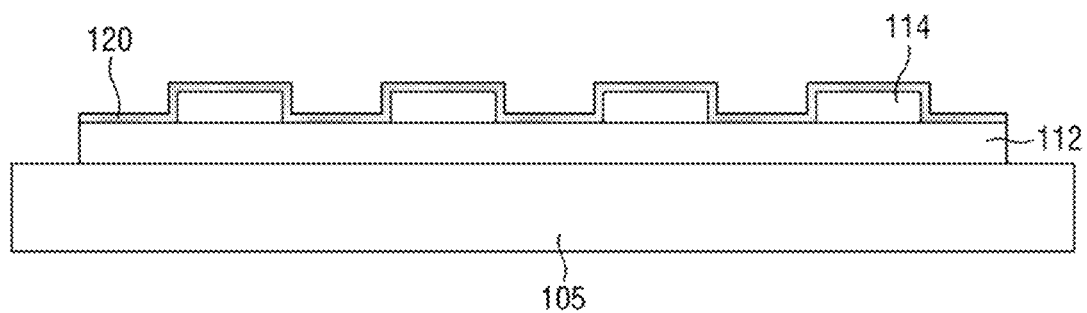
Figure 5:
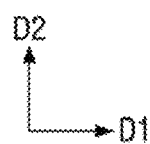

Referring to FIG. 5, a barrier layer 120 may be formed on the release layer 110. The barrier layer 120 may extend along the upper surface of the release layer 110. The barrier layer 120 may be conformally formed on the second release layer 114 and the first opening 114o. For example, the barrier layer 120 may cover the upper surface and the side surface of the second release layer 114 and may cover the first opening 114o. However, the present inventive concept is not limited thereto. For example, the barrier layer 120 may expose the upper surface of the first release layer 112, exposed by the first opening 114o, by not covering the first opening 114o.

The barrier layer 120 may include a metal material. The barrier layer 120 may include, for example, copper (Cu). The barrier layer 120 may include, but is not limited to, at least one of aluminum (Al), silver (Ag), tin (Sn), gold (Au), nickel (Ni), lead (Pb), titanium (Ti) and alloys thereof in another example.

The barrier layer 120 may be formed, but is not limited to, using a method such as physical vapor deposition (PVD), sputtering, and chemical vapor deposition (CVD).

Figure 6:
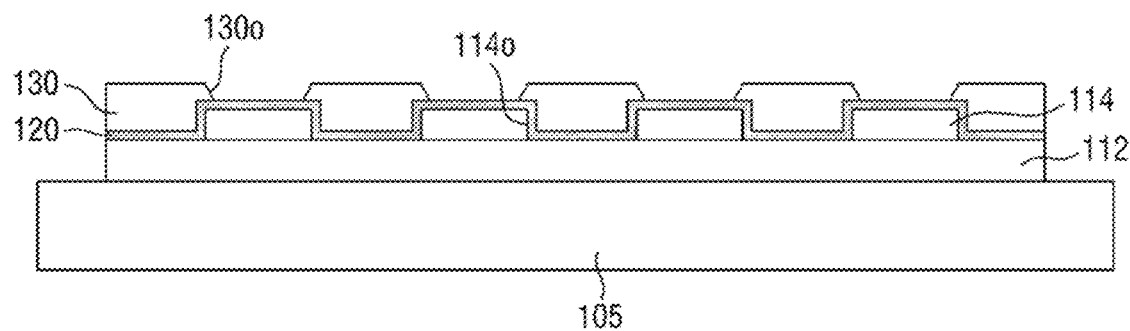
Figure 6:
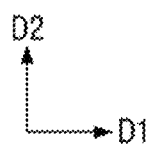

Subsequently, referring to FIG. 6, an electrode pad support layer 130 may be formed on the barrier layer 120. The electrode pad support layer 130 may expose at least a part of the barrier layer 120. The electrode pad support layer 130 may include a second opening 130o which exposes at least a part of an upper surface of the barrier layer 120. The second opening 130o may not overlap the first opening 114o. For example, the second opening 130o may not be formed on the first opening 114o. For example, the electrode pad support layer 130 may be formed in the second opening 130o. The second opening 130o may expose the upper surface of the barrier layer 120 formed on the second release layer 114.

The electrode pad support layer 130 may include the same material as the release layer 110. The electrode pad support layer 130 may include, for example, a photosensitive insulating material.

Figure 7:
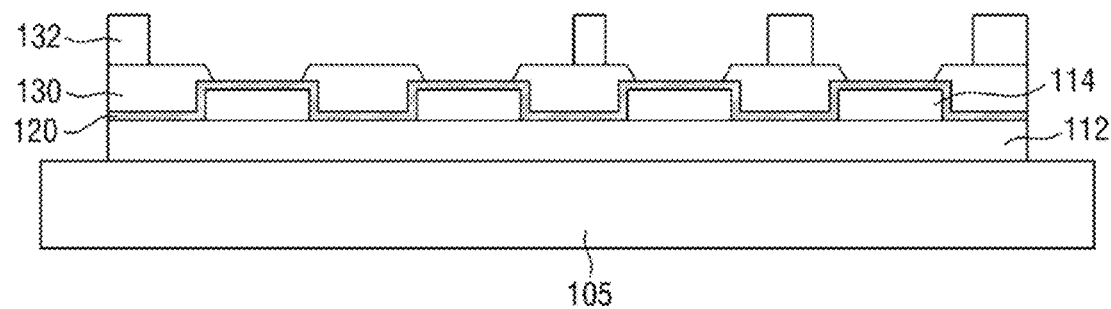

Referring to FIG. 7, a first insulating layer 132 may be formed on the electrode pad support layer 130. The first insulating layer 132 may include the same material as the electrode pad support layer 130. The first insulating layer 132 may be patterned by a photolithography process.

Figure 8:
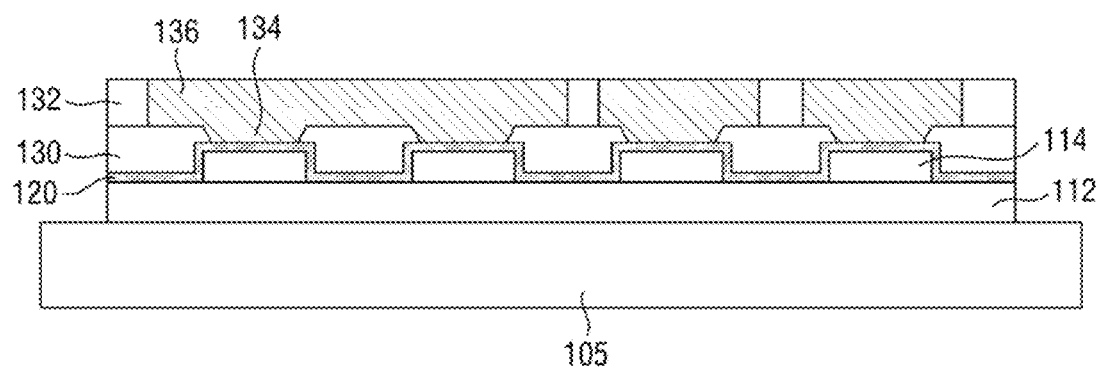

Referring to FIG. 8, an electrode pad 134 and a first wiring 136 may be formed on the electrode pad support layer 130 and the first insulating layer 132. For example, the electrode pad 134 and the first wiring 136 may be formed on the barrier layer 120.

The electrode pad 134 and the first wiring 136 may include the same material. The electrode pad 134 and the first wiring 136 may include the same material as the barrier layer 120. For example, the barrier layer 120 may include copper (Cu). For example, the electrode pad 134 and the first wiring 136 may be formed, using the barrier layer 120 as a seed layer. In another example, the electrode pad 134 and the first wiring 136 may include, but are not limited to, at least one of aluminum (Al), silver (Ag), tin (Sn), gold (Au), nickel (Ni), lead (Pb), titanium (Ti), and alloys thereof.

For example, the electrode pad 134 and the first wiring 136 may be formed by electroplating. The electrode pad 134 and the first wiring 136 may be simultaneously formed through a damascene process.

For example, the first wiring 136 may be partially etched by a chemical mechanical polishing (CMP) process. The first wiring 136 may be located at the same level as the first insulating layer 132. For example, an upper surface of the first wiring 136 and an upper surface of the first insulating layer 132 may be coplanar.

Figure 9:
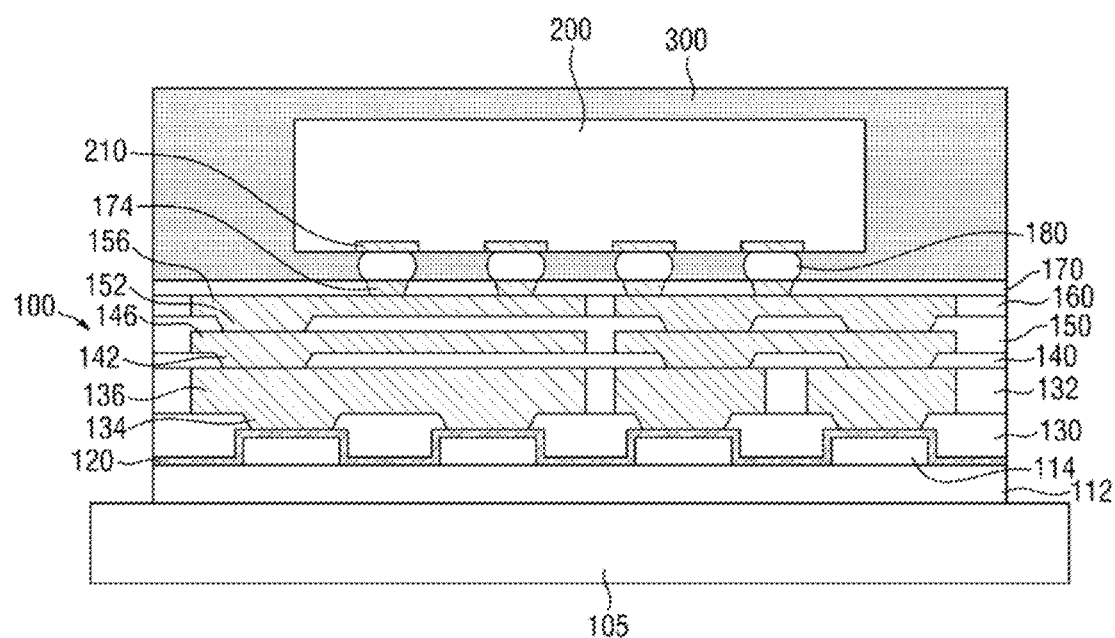

Referring to FIG. 9, the redistribution layer 100 including the electrode pad support layer 130, the electrode pad 134, the first wiring 136, and the first insulating layer 132 may be formed on the barrier layer 120. The redistribution layer 100 may include an electrode pad 134, a plurality of wirings 136, 146, 156 and 174, a plurality of vias 142 and 152, and a plurality of insulating layers 132, 140, 150, 160 and 170.

The electrode pad 134, the plurality of wirings 136, 146, 156 and 174 and the plurality of vias 142 and 152 may include the same material. The plurality of insulating layers 132, 140, 150, 160 and 170 may include the same material as the electrode pad support layer 130. The plurality of insulating layers 132, 140, 150, 160 and 170 may include, for example, a photosensitive insulating material. The plurality of insulating layers 132, 140, 150, 160 and 170 may be patterned by a photolithography process.

Subsequently, the first semiconductor chip 200 may be mounted on the first surface 100a of the redistribution layer 100. The first connection terminal 180 may be disposed between the redistribution layer 100 and the first semiconductor chip 200. The first connection terminal 180 may be disposed between the fourth wiring 174 and the first connection pad 210. The first connection terminal 180 may be in contact with the fourth wiring 174 and the first connection pad 210. The first semiconductor chip 200 may be electrically connected to the redistribution layer 100 through the first connection terminal 180.

For example, the method for fabricating a semiconductor device according to an exemplary embodiment of the present inventive concept may be performed in a chip last process in which the first semiconductor chip 200 is formed after the redistribution layer 100 is formed.

Subsequently, the first molding layer 300 may be formed to cover the first semiconductor chip 200. The first molding layer 300 may at least partially surround the side surface and the upper surface of the first semiconductor chip 200, and may be disposed between the first semiconductor chip 200 and the first surface 100a of the redistribution layer 100. The first molding layer 300 may surround the first connection terminal 180 and may fill the space between the adjacent first connection terminals 180.

Although the first molding layer 300 is shown to cover the upper surface of the first semiconductor chip 200 in this drawing, the upper surface of the first molding layer 300 and the upper surface of the first semiconductor chip 200 may be coplanar.

Figure 10:
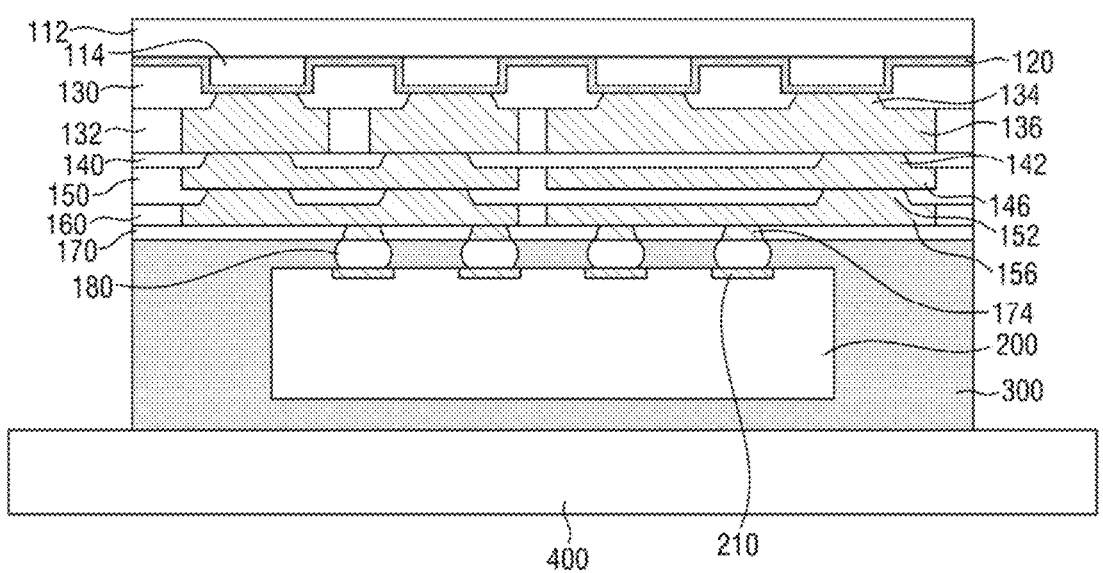

Referring to FIG. 10, the second carrier substrate 400 may be attached onto the first molding layer 300. The second carrier substrate 400 may be disposed on an upper surface of the first molding layer 300. For example, the second carrier substrate 400 may be disposed on a surface of the first molding layer 300 that is opposite to another surface (e.g., a lower surface) of the first molding layer 300 which is disposed on a first surface 100a of the redistribution layer 100. In an exemplary embodiment of the present inventive concept, an adhesive layer may be further formed between the second carrier substrate 400 and the first molding layer 300. The adhesive layer may include, for example, a polymer-based material light-to-heat conversion (LTHC) that may be removed together with the second carrier substrate 400. In addition, the adhesive layer may include, for example, an epoxy-based heat-release material, ultraviolet (UV) adhesive, or the like.

The second carrier substrate 400 may include, for example, silicon, metal, glass, plastic, ceramic or the like. The second carrier substrate 400 may be a carrier including the same material as the first carrier substrate 105. For example, the second carrier substrate 400 may be a tape.

Subsequently, the semiconductor package may be turned upside down. Thereafter, the first carrier substrate 105 may be removed from the semiconductor package. The first release layer 112 may be exposed. For example, the first carrier substrate 105 may be removed using a laser.

Figure 11:
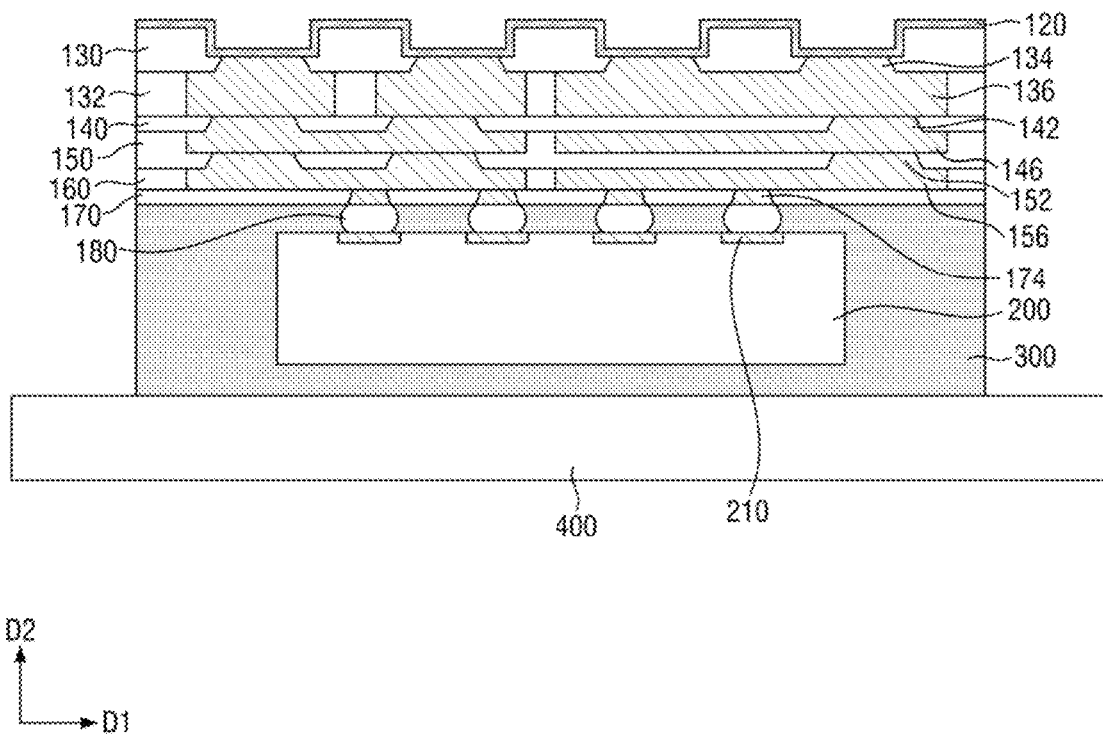

Referring to FIG. 11, the first release layer 112 and the second release layer 114 may be removed.

Light or a laser may be irradiated onto the first release layer 112. The first release layer 112 and the second release layer 114 may be removed, using a laser or light. For example, the first release layer 112 and the second release layer 114 may be removed by a laser ablation.

In addition, the removal of the first carrier substrate 105, the first release layer 112 and the second release layer 114 using the laser may be performed, by the use of the barrier layer 120 as a stop layer. Further, the barrier layer 120 may prevent the laser from penetrating the redistribution layer 100 including the electrode pad 134, the electrode pad support layer 130, the plurality of wirings 136, 146, 156 and 174, the plurality of vias 142 and 152, and the plurality of insulating layers 132, 140, 150, 160 and 170 at the time of laser irradiation. Therefore, the barrier layer 120 may prevent the redistribution layer 100 from being damaged in the process of removing the first carrier substrate 105, the first release layer 112 and the second release layer 114.

Figure 12:
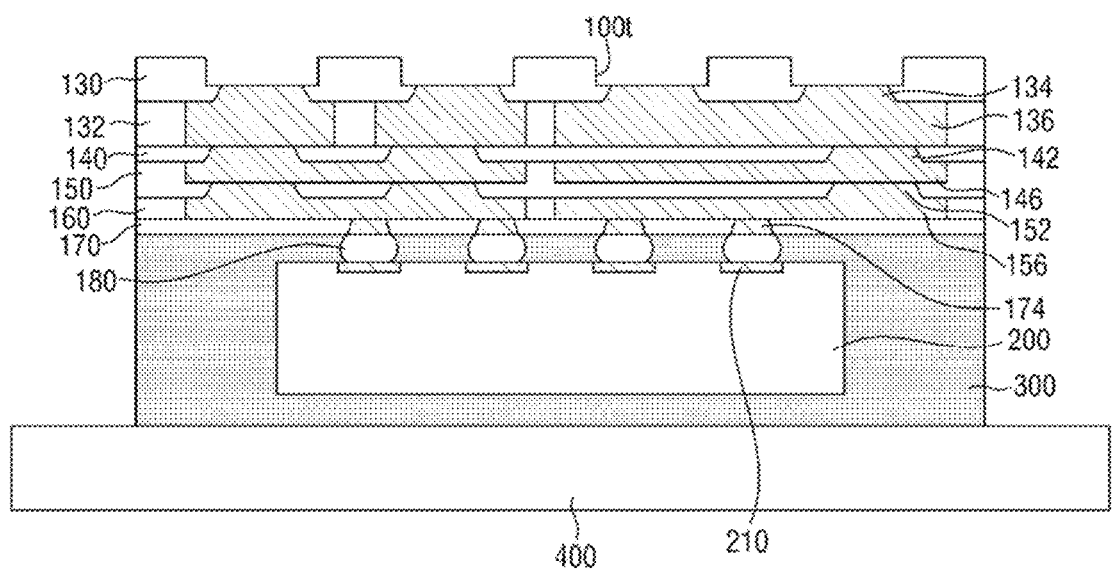

Referring to FIG. 12, the barrier layer 120 may be removed. Therefore, at least a part of the electrode pad 134 may be exposed. For example, the trench 100t provided by the electrode pad support layer 130 and the electrode pad 134 may be formed. The trench 100t may be formed at a position from which the second release layer 114 is removed. The trench 100t may be formed by the removal of the first release layer 112 and the second release layer 114.

Subsequently, referring to FIG. 1, the solder balls 500 may be formed on the trenches 100t. For example, the solder balls 500 may be formed in the trenches 100t. At least some of the solder balls 500 may be in contact with the electrode pad support layer 130. Therefore, the joining reliability between the solder ball 500 and the electrode pad 134 may be increased or developed.

The solder balls 500 may adjoin the electrode pads 134 exposed by the trenches 100t. The solder balls 500 may be electrically connected to a plurality of wirings 136, 146, 156 and 174.

Subsequently, a sawing process is performed, and the second carrier substrate 400 is removed to fabricate the semiconductor package shown in FIG. 1.

Figure 13:
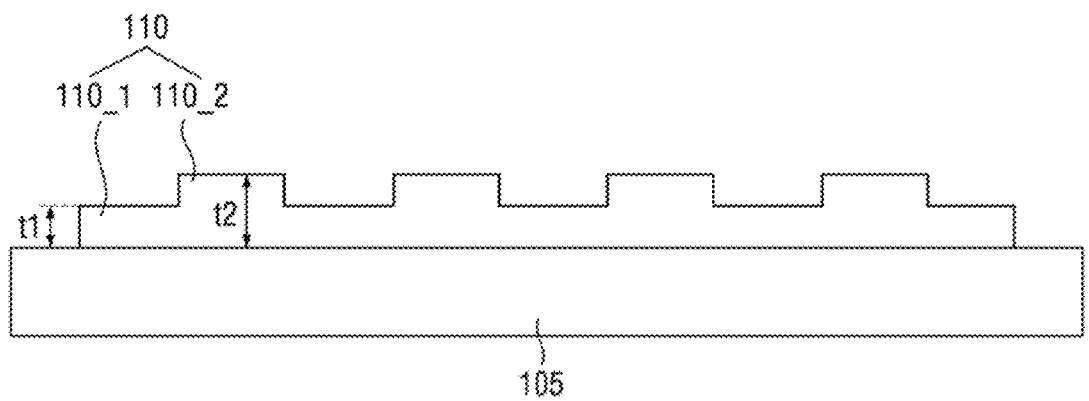
FIGS. 13 and 14 are intermediate step diagrams for illustrating a method for fabricating a semiconductor package according to an exemplary embodiment of the present inventive concept.
Figure 13:
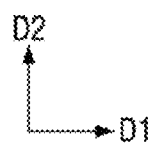
Figure 14:
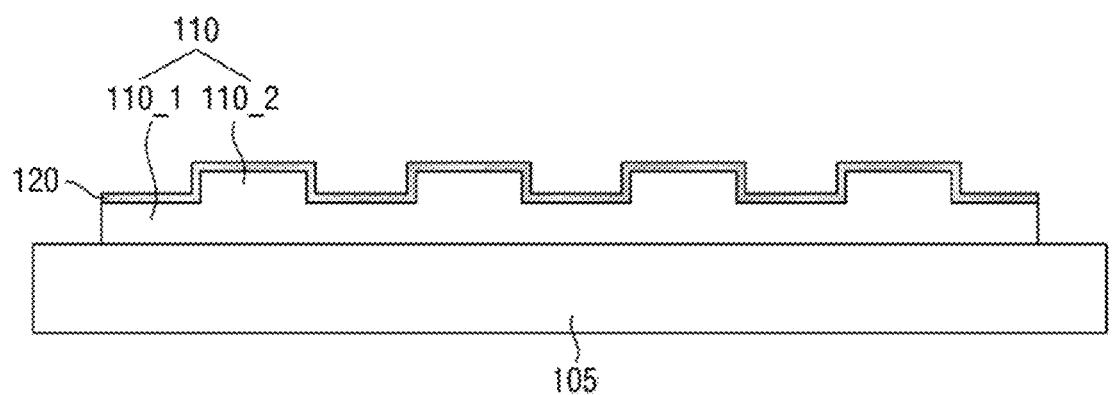
Figure 14:
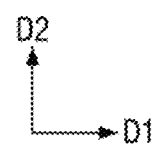

FIGS. 13 and 14 are intermediate step diagrams for illustrating a method for fabricating a semiconductor package according to an exemplary embodiment of the present inventive concept. Differences from those of FIGS. 3 and 4 will be mainly explained and any redundant descriptions may be omitted.

Referring to FIG. 13, in the method for fabricating a semiconductor package according to an exemplary embodiment of the present inventive concept, the release layer 110 may be formed on the first carrier substrate 105.

The release layer 110 may adjoin the first carrier substrate 105. The release layer 110 has a first portion 110_1 and a second portion 110_2. The first portion 110_1 has a first thickness t1, and the second portion 110_2 has a second thickness t2. In addition, as an example, the release layer 110 has a plurality of second portions 110_2 disposed to be spaced apart from each other in the first direction D1. For example, the first portion 1101 may be disposed between the second portions 110_2 adjacent to each other, and the second portion 1102 may be disposed between first portions 1101 adjacent to each other.

The first thickness t1 may be smaller than the second thickness t2. For example, the second portion 110_2 may protrude from the upper surface of the first carrier substrate 105. The upper surface of the second portion 110_2 may be placed above the upper surface of the first portion 110_1. Although a difference between the first thickness t1 and the second thickness t2 may be, for example, ranging between about 3 μm and about 8 μm, the present inventive concept is not limited thereto. For example, the difference between the first thickness t1 and the second thickness t2 may be about 3 μm or about 8 μm. For example, the difference in thickness would correspond to a thickness of a portion of the release layer 110 protruding from the first portion 110_1.

In an exemplary embodiment of the present inventive concept, the second portion 110_2 may protrude from an upper surface of the first portion 110_1.

The release layer 110 may include a photosensitive insulating material. The release layer 110 may be formed to include a first portion 110_1 and a second portion 110_2 by a photolithography process.

Referring to FIG. 14, the barrier layer 120 may be formed on the release layer 110. The barrier layer 120 may extend in the first direction D1 along the upper surface of the release layer 110. The barrier layer 120 may be conformally formed on the release layer 110. Subsequently, after sequentially performing the processes shown in FIGS. 6 to 12, the semiconductor package shown in FIG. 1 may be fabricated.

FIGS. 15 to 18 are intermediate step diagrams illustrating a method for fabricating a semiconductor package according to an exemplary embodiment of the present inventive concept.

Figure 15:
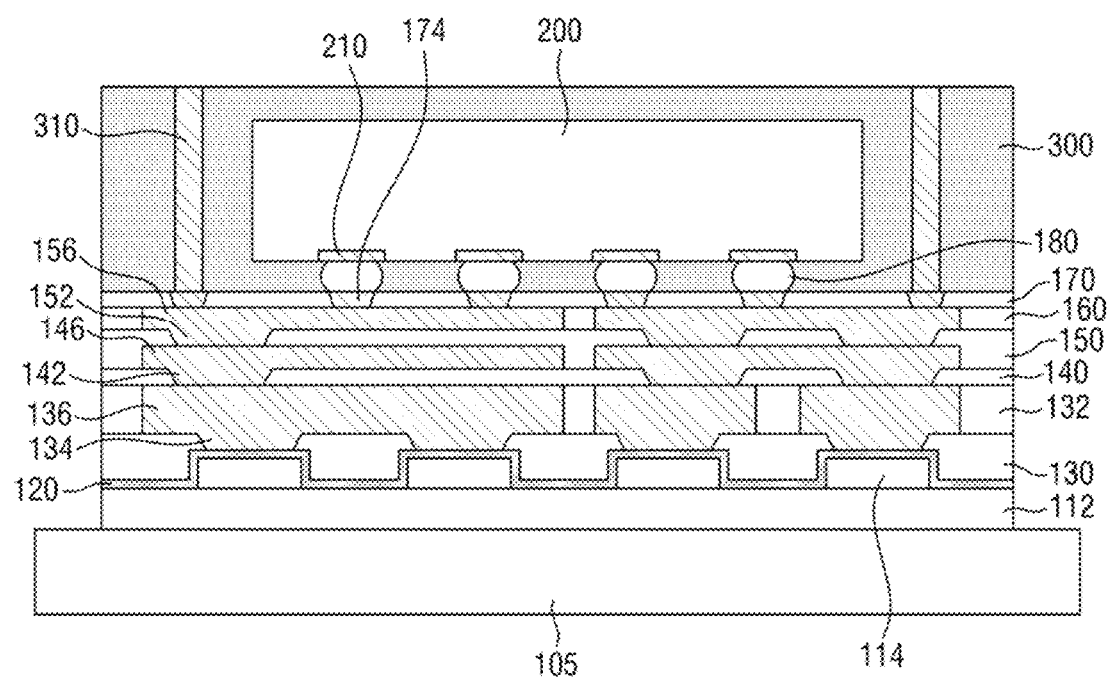
FIGS. 15, 16, 17 and 18 are intermediate step diagrams illustrating a method for fabricating a semiconductor package according to an exemplary embodiment of the present inventive concept.

Referring to FIG. 15, in the method for fabricating a semiconductor package according to an exemplary embodiment of the present inventive concept, after sequentially performing the processes shown in FIGS. 3 to 9, a penetration via 310 penetrating the first molding layer 300 in the direction D2 may be formed. The penetration via 310 may be formed on a side surface of the first semiconductor chip 200. The penetration via 310 may be formed on the exposed fourth wiring 174. The penetration via 310 may be electrically connected to the fourth wiring 174.

The penetration via 310 may include a conductive material. The penetration via 310 may include, for example, the same material as the plurality of wirings 136, 146, 156 and 174. The penetration via 310 may include, for example, copper (Cu). The penetration via 310 may include, in another example, at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al) and/or zirconium (Zr).

Figure 16:
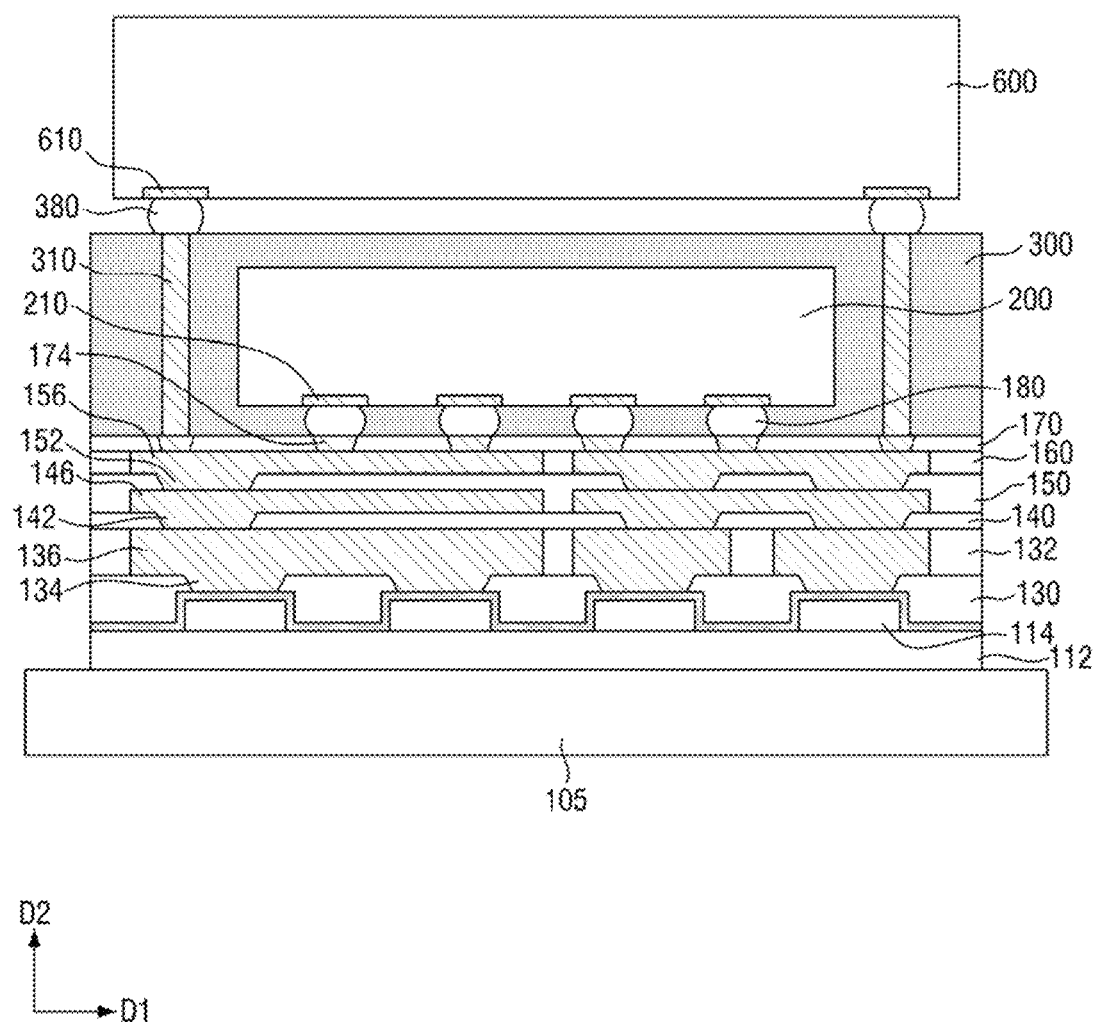

Referring to FIG. 16, a second semiconductor chip 600 may be mounted on the first semiconductor chip 200. The second semiconductor chip 600 may be a logic chip or a memory chip. The second semiconductor chip 600 may include a second connection pad 610. The second connection pad 610 may be disposed on a lower surface of the second semiconductor chip 600. The second connection pads 610 may be formed to be spaced apart from each other in the first direction D1.

The second connection pad 610 may be electrically connected to an electric circuit formed in the second semiconductor chip 600. The second semiconductor chip 600 may include a conductive material. The second semiconductor chip 600 may include a metal material such as aluminum (Al).

The second connection terminal 380 may be formed on the penetration via 310 and the second connection pad 610. The second connection terminal 380 may electrically connect the second semiconductor chip 600 and the penetration via 310 to each other.

The second connection terminal 380 may be, for example, a solder ball, a solder bump or a combination thereof. Although the second connection terminal 380 is shown as having a ball shape in this drawing, the present inventive concept is not limited thereto. The number, shape, size, and/or arrangement of the second connection terminals 380 shown in the drawings are not limited thereto, and may be various. For example, the second connection terminal 380 may have substantially the same size and shape as those of the first connection terminal 180, and may have a different size and shape as shown in this drawing.

Figure 17:
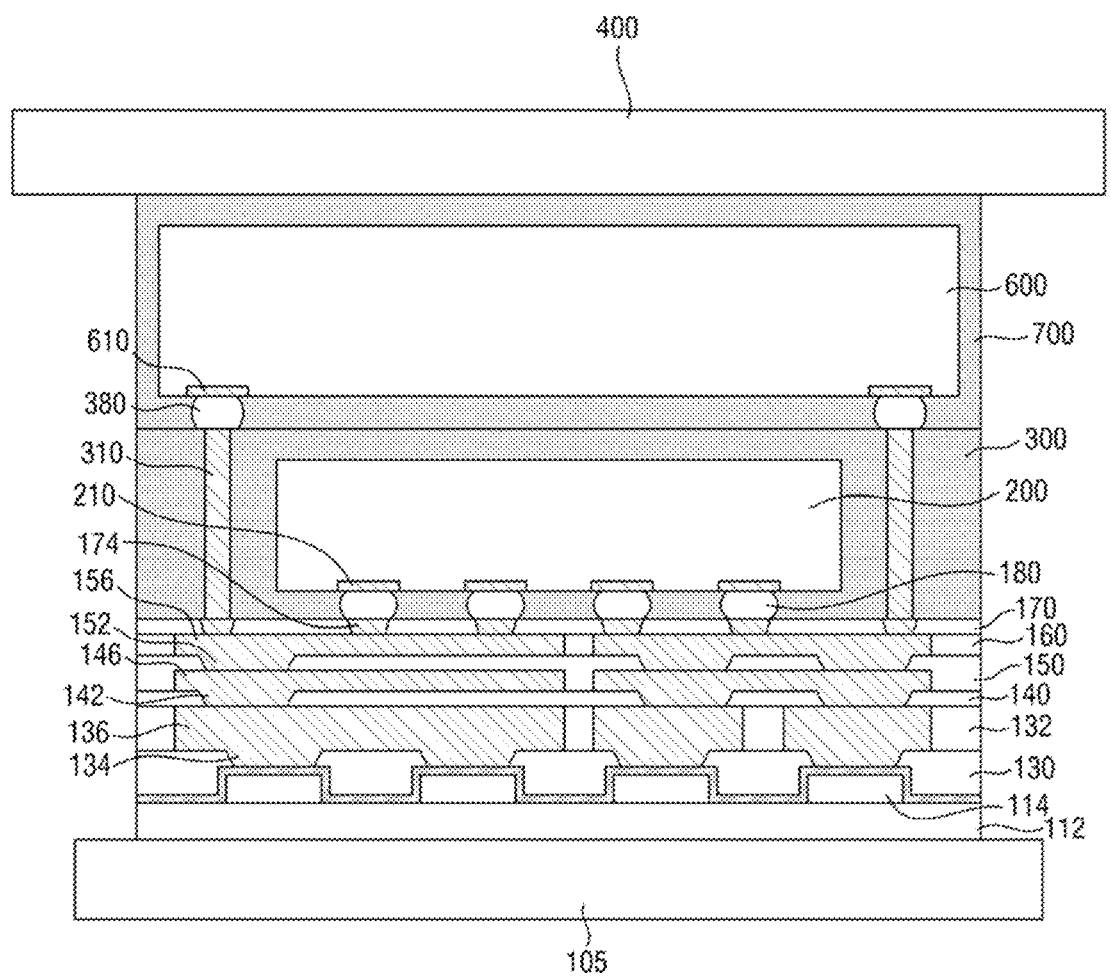

Referring to FIG. 17, a second molding layer 700 may be formed on the first molding layer 300. For example, the second molding layer 700 may be formed to surround the upper surface of the first molding layer 300. As an additional example, the second molding layer 700 may cover the second connection terminals 380. The second molding layer 700 may include, for example, an epoxy molding compound (EMC) or two or more kinds of silicon hybrid materials.

Subsequently, the second carrier substrate 400 may be attached onto the second molding layer 700.

Figure 18:
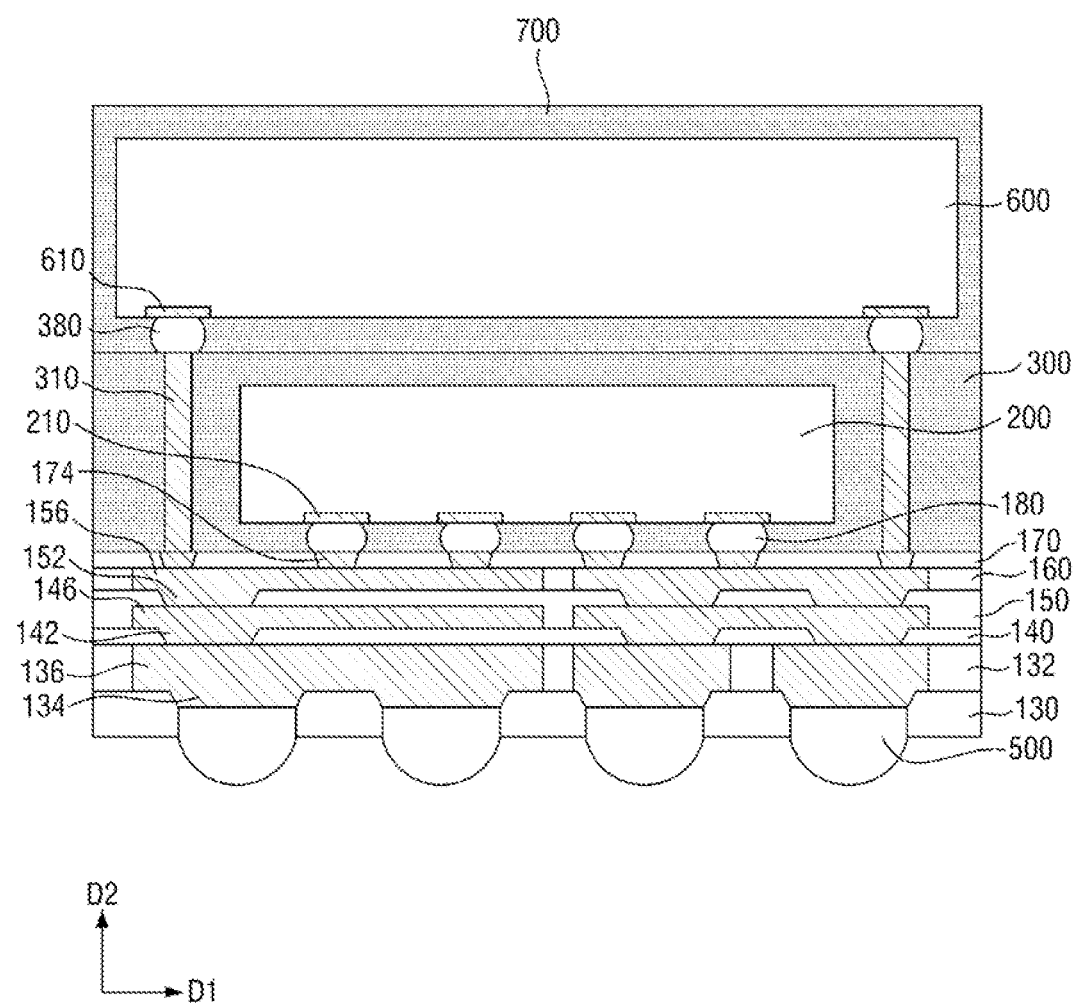

Subsequently, after sequentially performing the processes shown in FIGS. 10 to 12, the semiconductor package shown in FIG. 18 may be fabricated.

For example, the semiconductor package may be turned upside down. The first carrier substrate 105, the first release layer 112 and the second release layer 114 may be removed, using a laser. The solder ball 500 may be formed at a position from which the second release layer 114 is removed.

Figure 19:
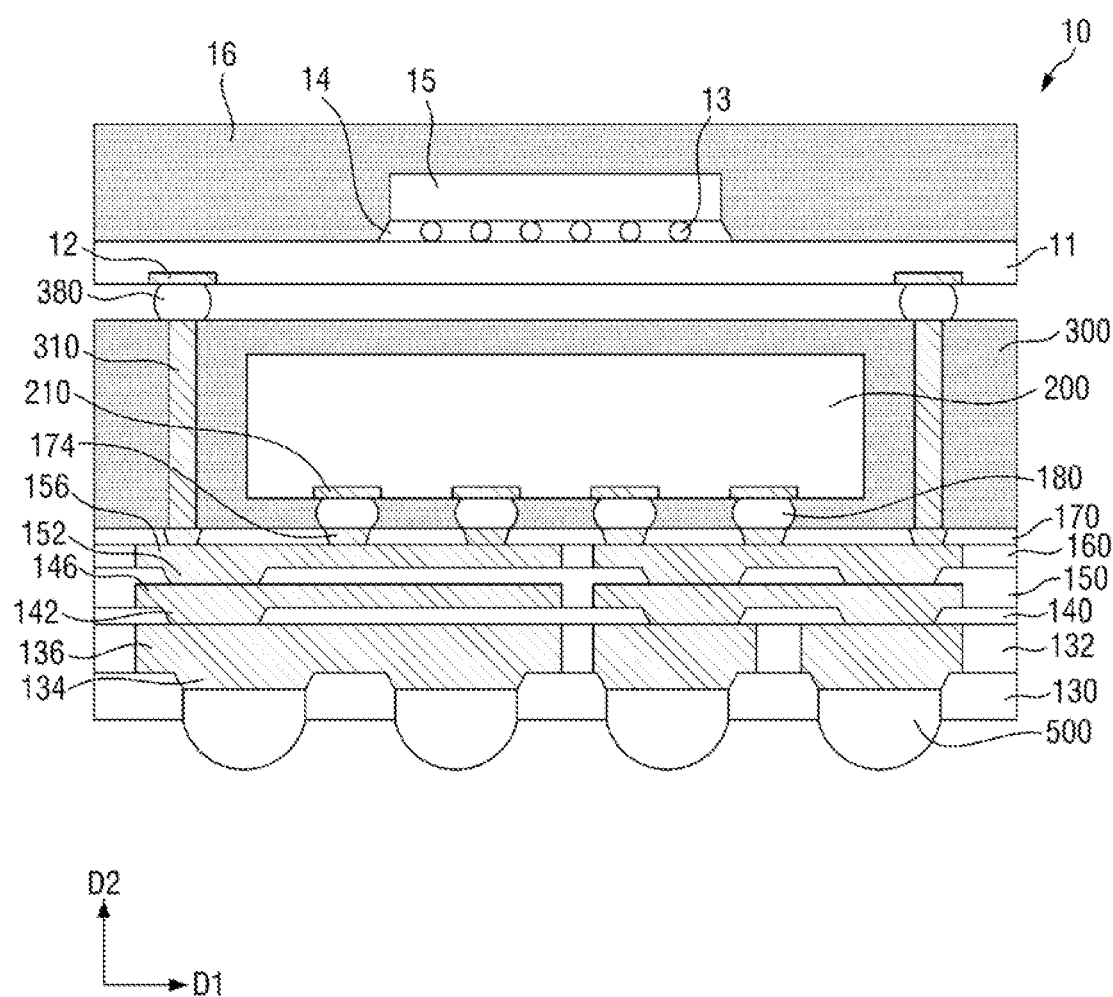
FIG. 19 is a diagram illustrating a semiconductor package fabricated by the method for fabricating a semiconductor package according to an exemplary embodiment of the present inventive concept.

FIG. 19 is a diagram for illustrating a semiconductor package fabricated by the method for fabricating a semiconductor package according to an exemplary embodiment of the present inventive concept.

Referring to FIG. 19, in the semiconductor package fabricated by the method for fabricating the semiconductor package according to an exemplary embodiment of the present inventive concept, the processes shown in FIGS. 3 to 9, 15 to 16 and 1 are sequentially performed to form a first package including the first semiconductor chip 200, and a second package 10 including the second semiconductor chip 15 may be formed on the first package.

The second package 10 may include a substrate 11, a second connection pad 12, a third connection terminal 13, an underfill material 14, a second semiconductor chip 15 and a second molding layer 16.

The substrate 11 may be, for example, a printed circuit board (PCB) substrate or a ceramic substrate. The substrate 11 may be an interposer in another example.

The second connection pad 12 may be disposed on the lower surface in the second semiconductor chip 15. The second connection pads 12 may be formed to be spaced apart from each other in the first direction D1. The second connection pads 12 may be electrically connected to an electric circuit formed in the second semiconductor chip 15. The second semiconductor chip 15 may include a conductive material. The second semiconductor chip 600 may include a metal material such as aluminum (Al).

The second connection terminal 380 may be formed on the penetration via 310 and the second connection pad 12. The second connection terminal 380 may electrically connect the second semiconductor chip 600 and the penetration via 310 to each other.

The second semiconductor chip 15 may be disposed on one surface of the substrate 11. The second semiconductor chip 15 may be a logic chip or a memory chip. The third connection terminal 13 may be formed between the substrate 11 and the second semiconductor chip 15. The third connection terminal 13 may adjoin a conductive terminal exposed on the substrate 11 and a conductive terminal exposed on the lower surface of the second semiconductor chip 15. The size of the third connection terminal 13 may be the same as the sizes of the first connection terminal 180, the second connection terminal 380 and the solder ball 500, and may be different as shown in this drawing. However, the present inventive concept is not limited thereto. For example, the third connection terminal 13 may have a different size from that of the first connection terminal 180, the second connection terminal 380 and the solder ball 500.

The underfill material 14 may be formed in an empty space between the substrate 11 and the second semiconductor chip 15. The underfill material 14 may fill the space between the adjacent third connection terminals 13. The underfill material 14 may protect the third connection terminal 13. The underfill material 14 may reduce the physical impact absorbed by the second semiconductor chip 15.

The second molding layer 16 may be formed on the substrate 11. The second molding layer 16 may at least partially surround the upper surface and the side surface of the second semiconductor chip 15 and the side surface of the underfill material 14.

The second package 10 may be electrically connected to the first package including the first semiconductor chip 200 through the third connection terminal 13 and the penetration via 310.

Figure 20:
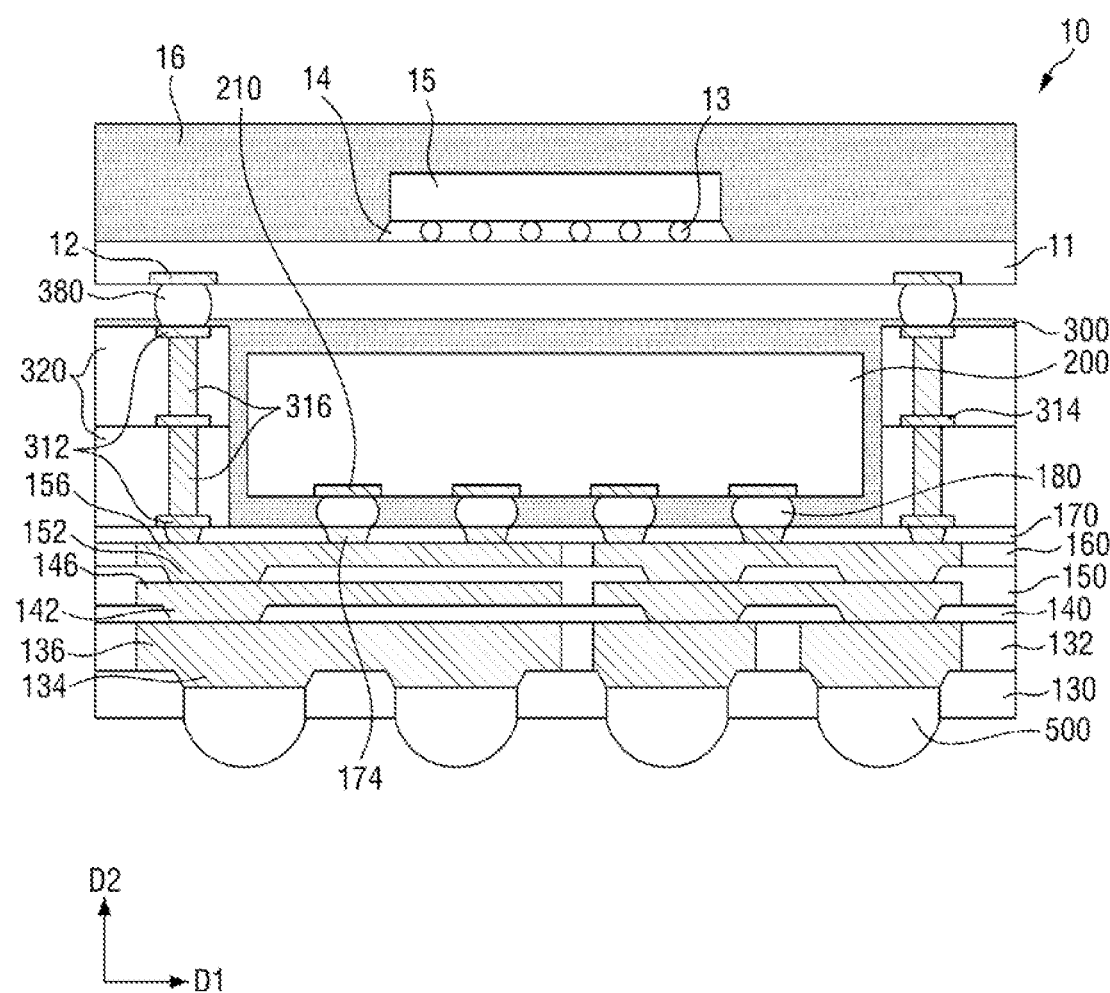
FIG. 20 is a diagram illustrating a semiconductor package fabricated by the method for fabricating a semiconductor package according to an exemplary embodiment of the present inventive concept.

FIG. 20 is a diagram illustrating a semiconductor package fabricated by the method for fabricating a semiconductor package according to an exemplary embodiment of the present inventive concept.

Referring to FIG. 20, in the semiconductor package fabricated by the method for fabricating a semiconductor package according to an exemplary embodiment of the present inventive concept, after sequentially performing the processes shown in FIGS. 3 through 8, a connection substrate may be formed on the first surface 100a of the redistribution layer 100. The connection substrate may be, for example, a PCB substrate. The connection substrate may include a base layer 320, a sub pad 312, a sub-wiring 314 and a sub-via 316. For example, there may be a plurality of connection substrates.

The sub pads 312 may be disposed on the upper surface and the lower surface of the connection substrate, respectively. The sub-wiring 314 may be interposed between the base layers 320. The sub-via 316 may penetrate the base layer 320 in the second direction D2. The sub-via 316 may be disposed on the sub-pad 312 and the sub-wiring 314. The sub-pad 312 and the sub-wiring 314 may be electrically connected to each other through the sub-via 316.

The sub-pad 312, the sub-wiring 314 and the sub-via 316 may include a conductive material. The sub-pad 312, the sub-wiring 314 and the sub-via 316 may include, for example, at least one of aluminum (Al), silver (Ag), tin (Sn), gold (Au), nickel (Ni), lead (Pb), titanium (Ti) and alloys thereof.

The first semiconductor chip 200 may be mounted between the connection substrates. For example, the connection substrates may be formed at opposing sides of the first semiconductor chip 200. In addition, after the first semiconductor chip 200 is mounted on the redistribution layer 100, the connection substrate may be formed on the side surface of the first semiconductor chip 200.

Subsequently, a first molding layer 300, which covers the connection substrate, and the side surfaces and the upper surface of the first semiconductor chip 200, may be formed. For example, a first package including the first semiconductor chip 200 may be formed. A second package 10 including the second semiconductor chip 15 may be formed on the first package. The second package 10 may be electrically connected to the first package including the first semiconductor chip 200 through the third connection terminal 13 and the connection substrate including the sub pad 312, the sub wiring 314, and the sub via 316. Since the second package 10 is explained in FIG. 19, explanation thereof will not be provided.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. A method for fabricating a semiconductor package, the method comprising:
    forming a release layer on a first carrier substrate, wherein the release layer includes a first portion and a second portion, wherein the first portion has a first thickness, and the second portion has a second thickness thicker than the first thickness;
    forming a barrier layer on the release layer;
    forming a redistribution layer on the barrier layer, wherein the redistribution layer includes a plurality of wirings and an insulating layer surrounding the plurality of wirings;
    mounting a semiconductor chip on the redistribution layer to be electrically connected to the redistribution layer;
    forming a molding layer on the redistribution layer to at least partially surround the semiconductor chip;
    attaching a second carrier substrate onto the molding layer;
    removing the first carrier substrate and the release layer;
    removing the barrier layer; and
    attaching a solder ball onto the redistribution layer exposed by removal of the barrier layer and the second portion of the release layer.

2. The method for fabricating the semiconductor package of claim 1, wherein the barrier layer includes a metal material.

3. The method for fabricating the semiconductor package of claim 2, wherein the metal material includes copper (Cu).

4. The method for fabricating the semiconductor package of claim 1, wherein the barrier layer includes the same material as the plurality of wirings.

5. The method for fabricating the semiconductor package of claim 1, wherein the formation of the release layer includes
    forming a first release layer having the first thickness on the first carrier substrate, and
    forming a second release layer on the first release layer, wherein the second release layer has a third thickness and includes an opening exposing at least a part of the first release layer,
    wherein the opening overlaps the first portion.

6. The method for fabricating the semiconductor package of claim 5, wherein the third thickness ranges between about 3 μm and about 8 μm.

7. The method for fabricating the semiconductor package of claim 1, wherein the removal of the release layer includes using a laser.

8. The method for fabricating the semiconductor package of claim 7, wherein the laser does not pass into the redistribution layer because of the barrier layer.

9. The method for fabricating the semiconductor package of claim 1, wherein the removal of the barrier layer and the second portion of the release layer exposes at least a part of the plurality of wirings of the redistribution layer, and
    the solder ball is electrically connected to the exposed plurality of wirings.

10. The method for fabricating the semiconductor package of claim 1, wherein the release layer includes the same material as the insulating layer.

11. The method for fabricating the semiconductor package of claim 1, wherein the release layer includes a photosensitive insulating material.

12. A method for fabricating a semiconductor package, the method comprising:
forming a first release layer on a first carrier substrate;
forming a second release layer on the first release layer, wherein the second release layer includes an opening for exposing at least a part of the first release layer;
forming a barrier layer on the second release layer;
forming a redistribution layer on the barrier layer, wherein the redistribution layer includes a plurality of wirings and an insulating layer surrounding the plurality of wirings;
mounting a first semiconductor chip on the redistribution layer, wherein the first semiconductor chip is electrically connected to the redistribution layer;
attaching a second carrier substrate onto the first semiconductor chip;
removing the first carrier substrate, the first release layer and the second release layer using a laser;
removing the barrier layer; and
attaching a solder ball to a position of the redistribution layer from which the second release layer is removed,
wherein the first release layer and the second release layer include a photosensitive insulating material.

13. The method for fabricating the semiconductor package of claim 12, wherein the first carrier substrate is a glass substrate.

14. The method for fabricating the semiconductor package of claim 12, wherein the second release layer has a thickness ranging between about 3 µm and about 8 µm.

15. The method for fabricating the semiconductor package of claim 12, wherein the barrier layer includes a metal material.

16. The method for fabricating the semiconductor package of claim 12, further comprising:
after mounting the first semiconductor chip on the redistribution layer,
forming a first molding layer on the redistribution layer, wherein the first molding layer at least partially surrounds the first semiconductor chip and includes a penetration via penetrating the first molding layer; and
mounting a second semiconductor chip on the first molding layer,
wherein the second carrier substrate is attached onto the second semiconductor chip.

17. The method for fabricating the semiconductor package of claim 16, wherein the second semiconductor chip is electrically connected to the redistribution layer through the penetration via.

18. The method for fabricating the semiconductor package of claim 12, further comprising:
after mounting the first semiconductor chip on the redistribution layer,
forming a first molding layer on the redistribution layer, wherein the first molding layer at least partially surrounds the first semiconductor chip;
forming connection substrates at opposing sides of the first semiconductor chip, wherein the connection substrates include a plurality of sub-wiring and a base layer at least partially surrounding the plurality of sub-wiring; and
mounting a package on the first molding layer, wherein the package includes a substrate, a second semiconductor chip mounted on the substrate, and a second molding layer at least partially surrounding the second semiconductor chip on the substrate,
wherein the second carrier substrate is attached onto the second molding layer,
and
the second semiconductor chip is electrically connected to the redistribution layer through the substrate and the connection substrate.

19. A method for fabricating a semiconductor package, the method comprising:
forming a first release layer on a first carrier substrate;
forming a second release layer on the first release layer, wherein the second release layer includes a first opening for exposing at least a part of an upper surface of the first release layer;
forming a barrier layer on the second release layer, wherein the barrier layer extends along an upper surface of the second release layer and includes a metal material;
forming an electrode pad support layer on the barrier layer, wherein the electrode pad support layer exposes at least a part of the barrier layer and includes a second opening not overlapping the first opening;
forming a redistribution layer on the electrode pad support layer, wherein the redistribution layer includes a plurality of wirings and an insulating layer surrounding the plurality of wirings;
mounting a semiconductor chip on the redistribution layer;
forming a molding layer surrounding the semiconductor chip on the redistribution layer;
attaching a second carrier substrate onto the molding layer;
removing the first carrier substrate, the first release layer and the second release layer, using a laser;
removing the barrier layer;
forming a solder ball at a position from which the second release layer is removed; and
removing the second carrier substrate,
wherein the first release layer, the second release layer and the insulating layer include a photosensitive insulating material.

20. The method for fabricating the semiconductor package of claim 19, wherein the barrier layer includes the same material as the plurality of wirings.

* * * * *